(12) United States Patent
Lee

(10) Patent No.: US 6,434,062 B2
(45) Date of Patent: Aug. 13, 2002

(54) DELAY LOCKED LOOP FOR USE IN SEMICONDUCTOR MEMORY DEVICE

(75) Inventor: Seong-Hoon Lee, Ichon-shi (KR)

(73) Assignee: Hynix Semiconductor, Seoul (KR)

( * ) Notice: Subject to any disclaimer, the term of this patent is extended or adjusted under 35 U.S.C. 154(b) by 0 days.

(21) Appl. No.: 09/745,490

(22) Filed: Dec. 21, 2000

(30) Foreign Application Priority Data

Dec. 24, 1999 (KR) .............................................. 99-62227

(51) Int. Cl.[7] .................................................. G11C 7/00
(52) U.S. Cl. ........................................ 365/194; 365/236
(58) Field of Search ........................... 375/376; 365/194, 365/236

(56) References Cited

U.S. PATENT DOCUMENTS 6,005,904 A * 12/1999 Knapp et al. ............... 375/376

* cited by examiner

Primary Examiner—M. Tran
(74) Attorney, Agent, or Firm—Townsend and Townsend and Crew LLP

(57) ABSTRACT

It is provided a delay locked loop for obtaining a reduced jitter and a stable time delay adjustment to thereby perform a bi-directional time delay with a small area even at low frequency applications. The delay locked loop includes an input unit for receiving a clock signal and a non-clock signal and comparing received signals to produce an internal clock signal, a controller for receiving the internal clock to produce a control signal, a bi-directional oscillator, responsive to the control signal from the control means, for performing a ring oscillation in a first or second direction and fulfilling an addition and subtraction adjustment function for a time delay, a counter for receiving an output signal of the bi-directional oscillator and counting the number that the signal is passed therethrough, and an AND gate for performing a combination operation on the outputs of the bi-directional oscillating means and the counting means, to produce the result as a final internal clock signal.

28 Claims, 14 Drawing Sheets

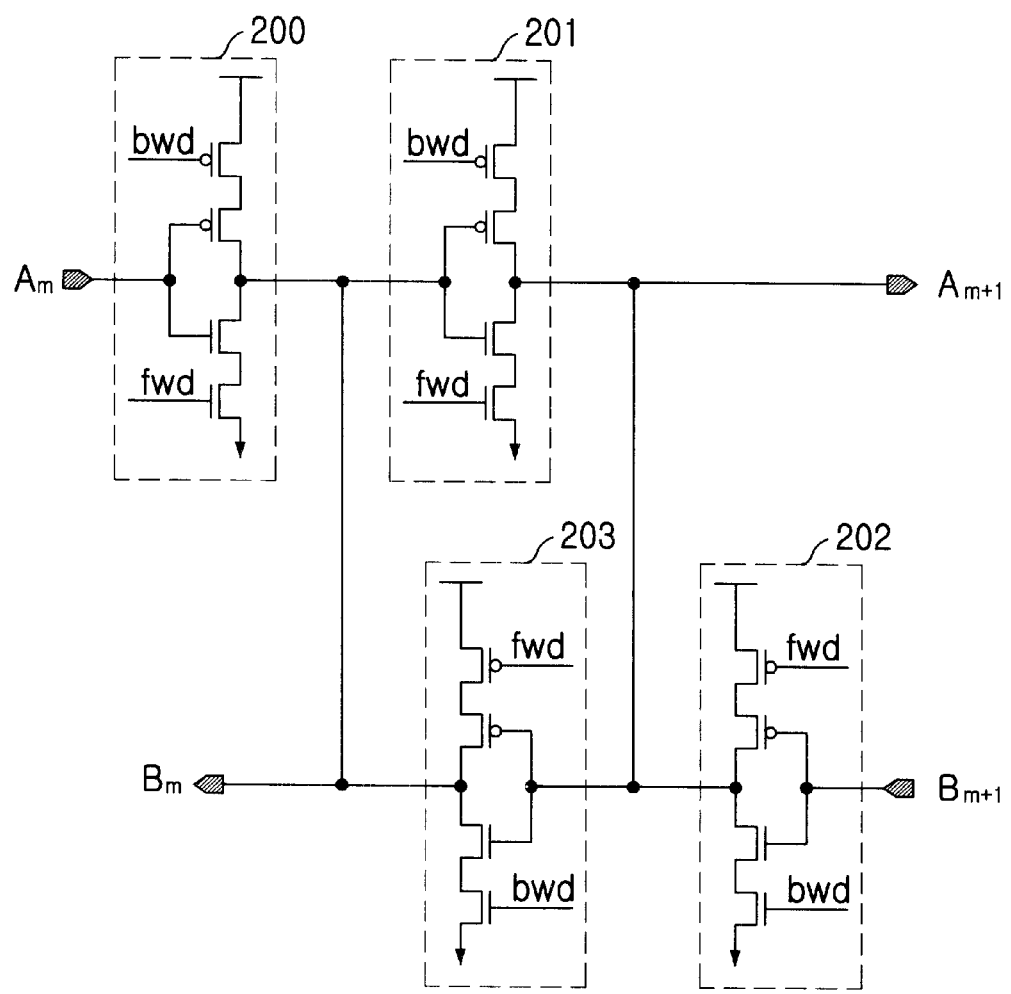

DELAY LOCKED LOOP FOR USE IN SEMICONDUCTOR MEMORY DEVICE

BACKGROUND OF THE INVENTION

The present invention relates to a semiconductor memory device; and, more particularly, to a delay locked loop using a bi-directional ring oscillator and a counter unit.

Description of the Prior Art

In general, a delay locked loop (DLL) circuit reduces or compensates a skew between a clock signal and data or between an external clock and an internal clock, which is used in synchronizing an internal clock of a synchronous memory to an external clock without incurring any error. Typically, a timing delay occurs when a clock provided externally is used within the apparatus. The delay locked loop controls the timing delay to synchronize the internal clock to the external clock.

The synchronization between the internal and external clocks requires operations of compensating a jitter of the external clock with an internal delay locked loop, controlling a time delay unit such that a delay of the internal clock is less sensitive to noise introduced by a power supply or random noises, and fastening a locking time at maximum through the control of the time delay unit. A delay locked loop with a reduced jitter and an easily controllable time delay unit to satisfy the foregoing requirements has been recently presented in ISSCC paper in 1999, entitled "A 250 Mb/s/pin 1 Gb Double Data Rate SDRAM with a Bi-Directional Delay and an Inter-Bank Shared Redundancy Scheme" by NEC Corporation.

FIG. 1 is a connection diagram of a conventional linear bi-directional delay DLL proposed by NEC Corporation.

Referring to FIG. 1, the conventional DLL includes an input unit 100, a first to a third D-flip flop 101, 103 and 104, a first inverter 102, a dummy delay unit 105, a first and a second AND gate 106 and 107, a first and a second bi-directional delay block 108 and 109, a first and a second pulse generation unit 110 and 111, and an OR gate 112.

The input unit 100 receives a clock signal CLK and a non-clock signal CLKB via positive and negative terminals respectively and compares received signals to produce a rising clock Rclk. The first D-flip slop 101 receives the rising clock Rclk as a clock signal and outputs a control signal with a pulse duration corresponding to one cycle of the rising clock Rclk. The first inverter 102 inverts the output of the first D-flip flop 101 to produce an inverted signal to be fed back as input to the first D-flip flop 101. The second D-flip flop 103 receives the output of the first D-flip flop 101 and the rising clock Rclk from the input unit 100 and produces a first forward signal FWD_A having a pulse duration corresponding to one cycle of the output of the first D-flip flop 101 and a first backward signal BWD_A having an opposite phase to the first forward signal FWD_A. The third D-flip flop 104 receives an inverted value of the output of the first D-flip flop 101 and the rising clock Rclk, and produces a second forward signal FWD_B having a pulse duration corresponding to one cycle of the output of the first D-flip flop 101 and a second backward signal BWD_B having an opposite phase to the second forward signal FWD_B.

The dummy delay unit 105 delays the rising clock Rclk by a skew to compensate the clock signal CLK. The first AND gate 106 logically combines the outputs of the second D-flip flop 103 and the dummy delay unit 105 to produce a combined output. The second AND gate 107 logically combines the outputs of the third D-flip flop 104 and the dummy delay unit 105 to produce a combined output.

The first bi-directional delay block 108 including a multiplicity of unit bi-directional delays which are connected serially, receives the output of the first AND gate 106 and controls a time delay in a first or second direction under the control of the first forward signal FWD_A and the first backward signal BWD_A.

The second bi-directional delay block 109 including a multiplicity of unit bi-directional delays which are connected in series, receives the output of the second AND gate 107 and controls a time delay in the first or second direction under the control of the second forward signal FWD_B and the second backward signal BWD_B.

The first pulse generation unit 110 generates a pulse at a rising and a falling edge of the output of the first bi-directional delay block 108. The second pulse generation unit 111 generates a pulse at a rising and a falling edge of the output of the second bi-directional delay block 109. The OR gate 112 performs an OR operation on the outputs of the first and second pulse generation units 110 and 111.

FIG. 2A is a connection diagram of a conventional unit bi-directional delay, which has been proposed by FUJITSU Ltd.

As shown in FIG. 2A, the unit bi-directional delay proposed by FUJITSU includes four three-phase buffers 200, 201, 202 and 203.

The first three-phase buffer 200 receives one of the outputs of the first and second AND gates as a first input signal $A_m$ to produce a second control signal $B_m$, wherein the gate of a PMOS transistor is controlled by the first or second backward signal (hereinafter called BWD) and the gate of an NMOS transistor is controlled by the first or second forward signal (hereinafter called FWD). The second three-phase buffer 201 receives the second output signal $B_m$, wherein the gate of a PMOS transistor is controlled by the BWD signal and the gate of an NMOS transistor is controlled by the FWD signal.

The third three-phase buffer 202 receives the output of a unit bi-directional delay at a previous stage as a second input signal $B_{m+1}$, to produce a first output signal $A_{m+1}$, wherein the gate of a PMOS transistor is controlled by the backward signal BWD and the gate of an NMOS transistor is controlled by the forward signal FWD.

The fourth three-phase buffer 203 receives the first output signal $A_{m+1}$ to produce the second output signal $B_m$, wherein the gate of a PMOS transistor is controlled by the forward signal FWD and the gate of an NMOS transistor is controlled by the backward signal BWD.

When the forward signal FWD is logic high and the backward signal BWD is logic low, the first and second three-phase buffers 200 and 201 are activated to provide input signal to the first direction (i.e., the forward direction). When the forward signal FWD is logic low and the backward signal BWD is logic high, the third and fourth three-phase buffers 202 and 203 are activated to provide input signal to the second direction (i.e., the backward direction).

FIG. 2B is a symbolic diagram of the unit bi-directional delay shown in FIG. 2A. The construction and operation of the device in FIG. 2B is similar that of the device previously described in conjunction with FIG. 2A and therefore a further description thereof is omitted.

FIG. 2C is a connection diagram of the unit bi-directional delay proposed by NEC Corporation.

As shown in FIG. 2C, a difference between NEC and FUJITSU is that the PMOS transistor is removed in the first and fourth three-phase buffers 200 and 203, and the NMOS transistor is removed in the second and third three-phase buffers 201 and 202, preventing both of the first and second input signals $A_m$ and $B_{m+1}$ with a logic low value from being transmitted to corresponding buffers.

Although the construction of the delay locked loop described above generates a DLL signal at the rising clock Rclk of the clock signal CLK, the construction for the rising clock Rclk is similar to that of a delay locked loop for outputting the DLL signal at the falling clock Fclk of the clock signal CLK except that the output signal of the input unit 100 is a falling clock.

FIG. 3 is a timing diagram illustrating the operating principle of the first and second bi-directional delay blocks.

Referring to FIG. 3, in case the first forward signal FWD_A is logic high and the first backward signal BWD_A is logic low, when the first output signal A0_A is rendered to a logic high after a compensation skew $t_{dm}$, the logic high signal A0_A is propagated to the first direction (i.e., the forward direction). In this case, there is a prior condition that all the forward nodes (Am_A, m=0, 1, 2, . . . , 40) should be set to logic low and all the backward nodes (Bm_B, m=0, 1, 2, . . . , 40) should be set to logic high. Since rendering of the forward node to logic high allows the backward node corresponding thereto to be rendered to logic low, it is necessary to set the backward node to logic low in all positions to which the logic high is transmitted.

Thereafter, the first forward signal FWD_A is rendered to a logic low and the first backward signal BWD_A is rendered to a logic high, at the same time that the logic high signal is propagated to the second direction (i.e., the backward direction) to thereby render the first output signal $B_0$_A to a logic high after an interval $t_{clk}$-$t_{dm}$, wherein $t_{clk}$ is one clock cycle. That is, the signal precedes a rising edge of a subsequent clock by $t_{dm}$. As mentioned above, since a signal preceding the rising edge by $t_{dm}$ per two clock cycles may be obtained, an additional bi-directional delay line is provided, and the delay lines are operated alternatively, allowing as DLL clock to be obtained at each cycle. The logic high of the second output signal B0_A means that all the backward nodes have been rendered to logic high and also all the forward nodes have been rendered to logic low. In short, a reset may be automatically performed for subsequent processes without any reset operation.

The delay locked loop may be implemented with the bi-directional delay. However, in low frequency applications, the interval $t_{clk}$-$t_{dm}$ increases with an increase in one clock cycle $t_{clk}$, so that the bi-directional delay line should be lengthened by an increased interval. That is, many unit bi-directional delays are additionally required.

The first and second bi-directional delay blocks 108 and 109 of the delay locked loop shown in FIG. 1 include 40 stages of unit bi-directional delays to adjust a time delay in low frequency applications, and four control signal lines to be used in controlling each of the unit bi-directional delays.

Accordingly, the prior art imposes great chip area requirements, which, in turn, may decrease the number of chips per wafer, thereby leading to increase in cost for the apparatus.

SUMMARY OF THE INVENTION

It is, therefore, a primary object of the present invention to provide a delay locked loop, which is capable of achieving a reduced jitter and a stable time delay adjustment, to thereby perform a bi-directional time delay with a small area even in low frequency applications.

In accordance with a preferred embodiment of the present invention, there is provided a delay locked loop for use in a semiconductor memory device, which comprises: an input unit for receiving a clock signal and a non-clock signal and comparing received signals to produce an internal clock signal; a controller for receiving the internal clock to produce a first forward signal and a second backward signal each having a pulse duration corresponding to one cycle of the clock signal, a first backward signal and a second forward signal each having an opposite phase to the first forward signal and the second backward signal, and a first and a second start signal each having a pulse duration corresponding to a time delay to be compensated; a bi-directional oscillator, responsive to the second forward signal, the second backward signal and the second start signal, for performing a ring oscillation in a first or second direction and fulfilling an addition and subtraction adjustment function for a time delay; a counter for receiving an output signal of the bi-directional oscillator and counting the ring oscillations; and an output means for performing a combination operation on the outputs of the bi-directional oscillator and the counter, to produce the result as a final internal clock signal.

By changing a linear structure into a ring structure, the present invention employs only four stages of unit bi-directional delay block and a three-bits counter to allow an operation to be performed at frequencies up to 40 MHz. Also, the present invention employs only four stages of unit bi-directional delay block and a four-bits counter to allow the operation to be performed at frequencies up to 20 MHz. Accordingly, the present invention has the ability to implement a delay locked loop with a reduced layout requirement even at a low frequency of 25 MHz corresponding to a wafer test frequency.

BRIEF DESCRIPTION OF THE DRAWINGS

The above and other objects and features of the present invention will become apparent from the following description of the preferred embodiments given in conjunction with the accompanying drawings, in which:

FIG. 2A is connection diagram of a conventional unit bi-directional delay which has been proposed by FUJITSU Ltd.;

DESCRIPTION OF THE SPECIFIC EMBODIMENTS

Figure 1:
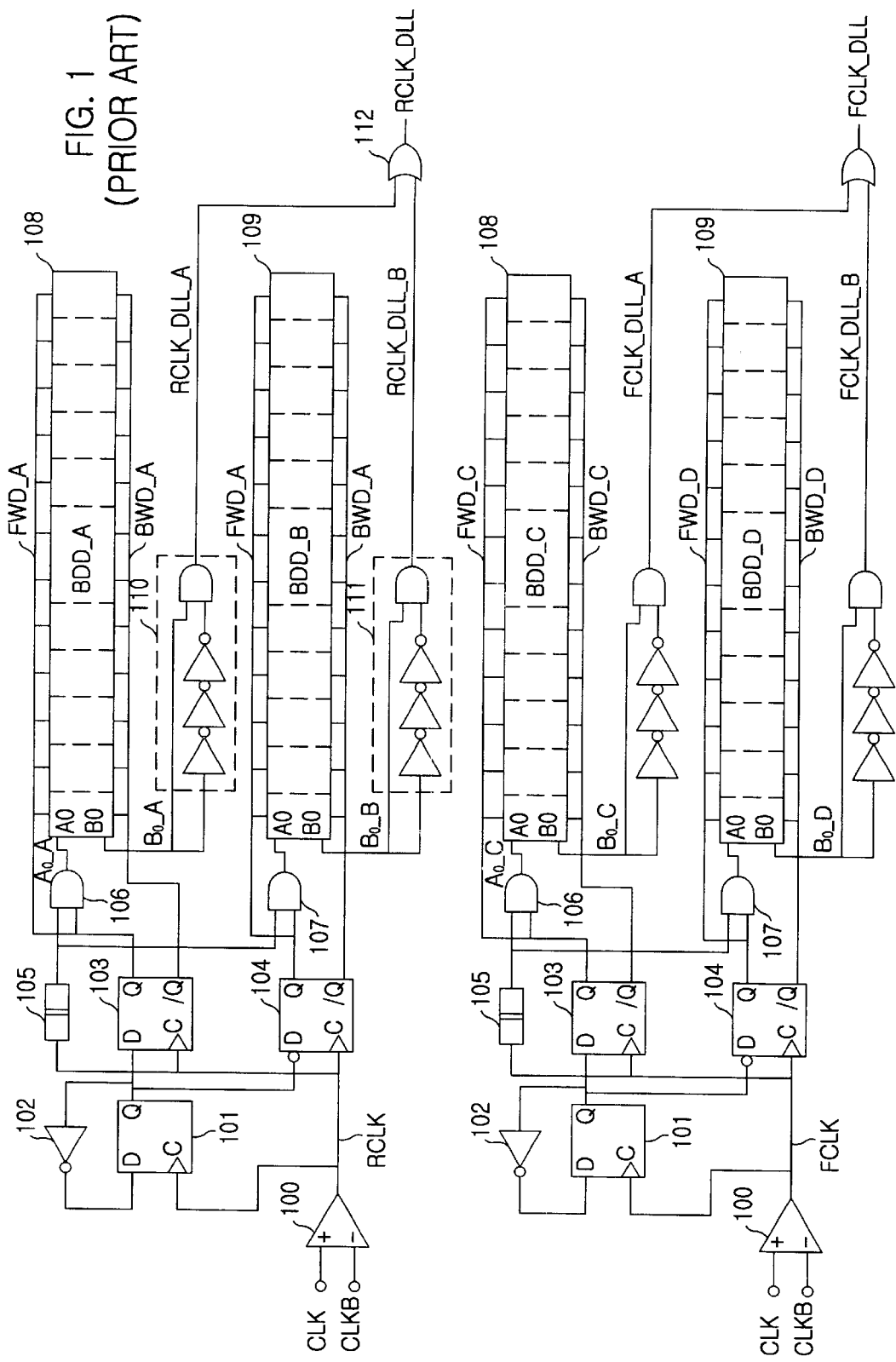
FIG. 1 shows a connection diagram of a conventional linear bi-directional delay DLL proposed by NEC Corporation.
Figure 2B:
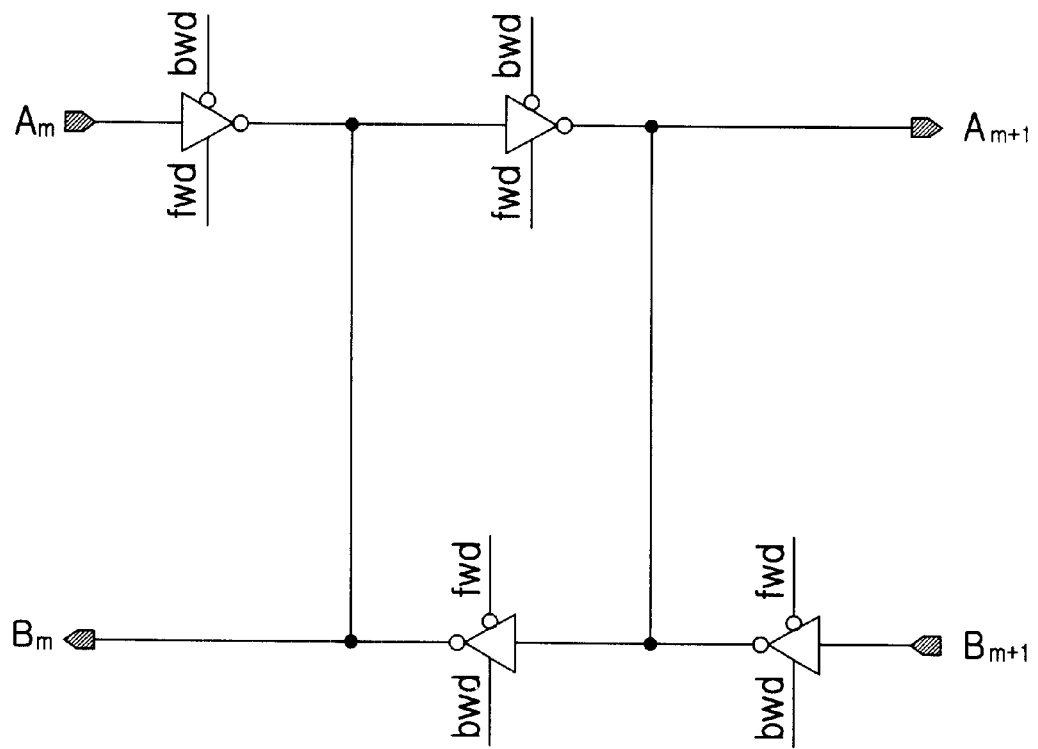
FIG. 2B is a symbolic diagram of the unit bi-directional delay shown in FIG. 2A.
Figure 2C:
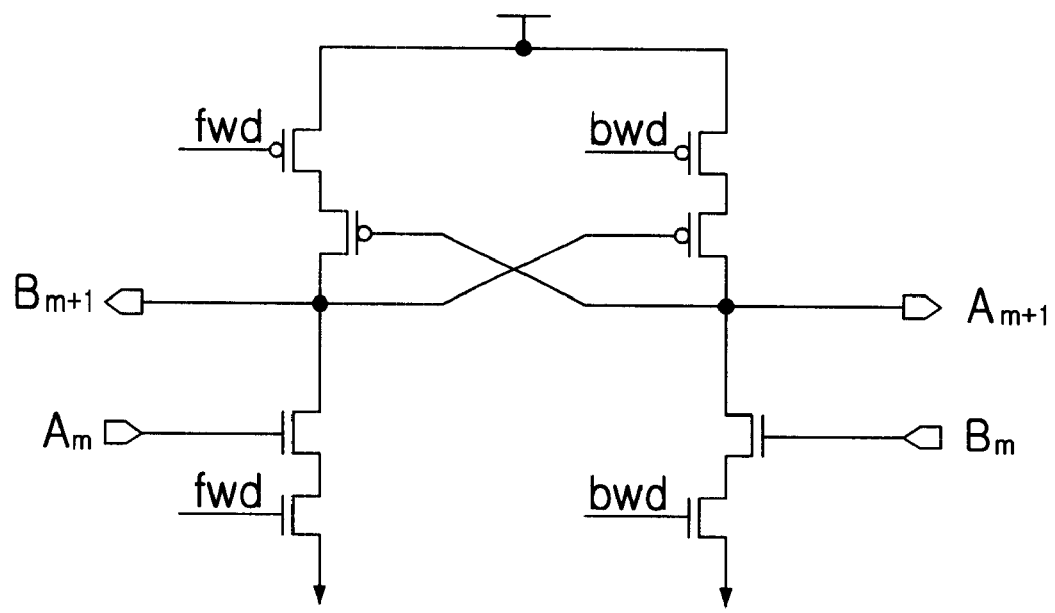
FIG. 2C is a connection diagram of the unit bi-directional delay proposed by NEC Corporation.
Figure 3:
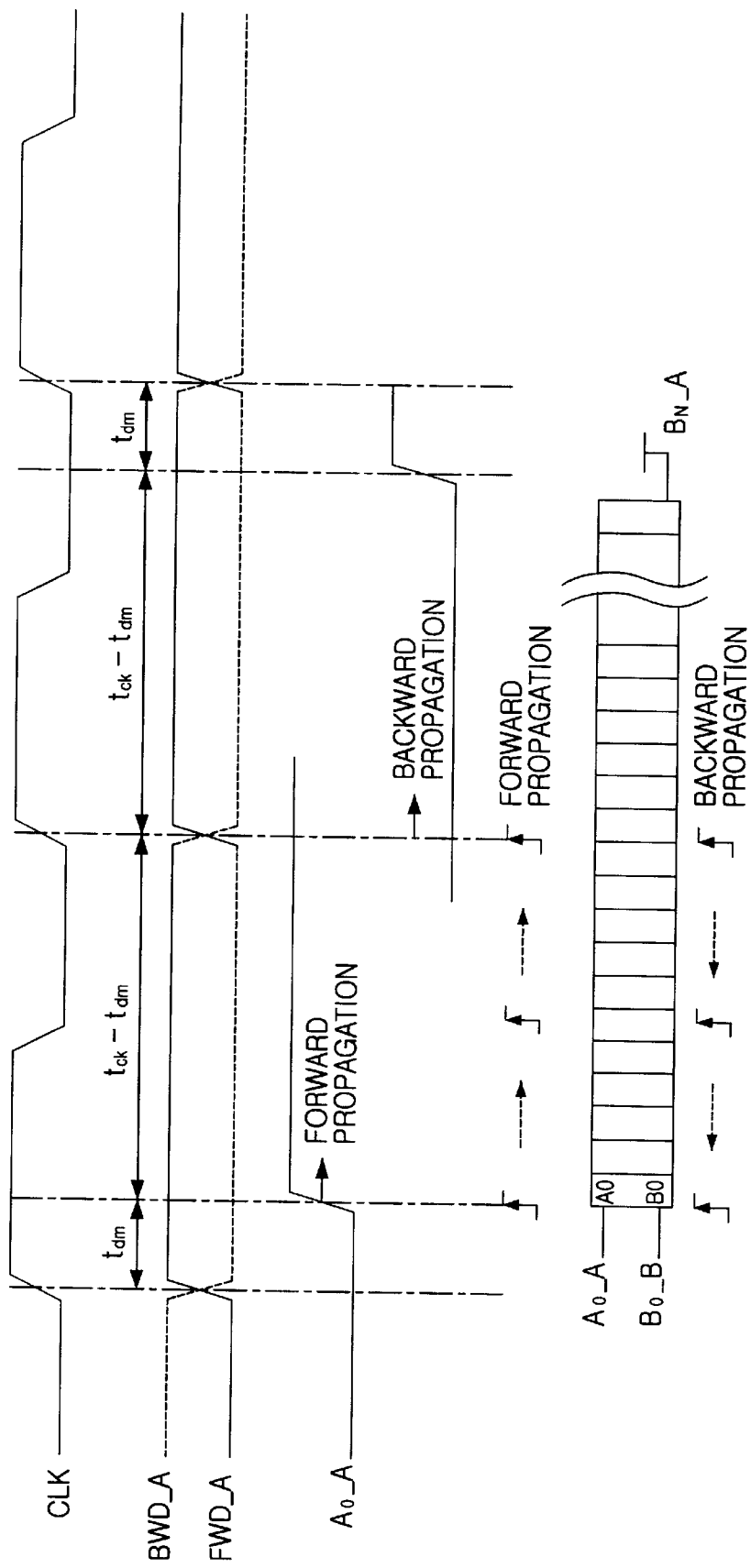
FIG. 3 is a timing diagram illustrating the operating principle of the first and second bi-directional delay blocks.
Figure 4:
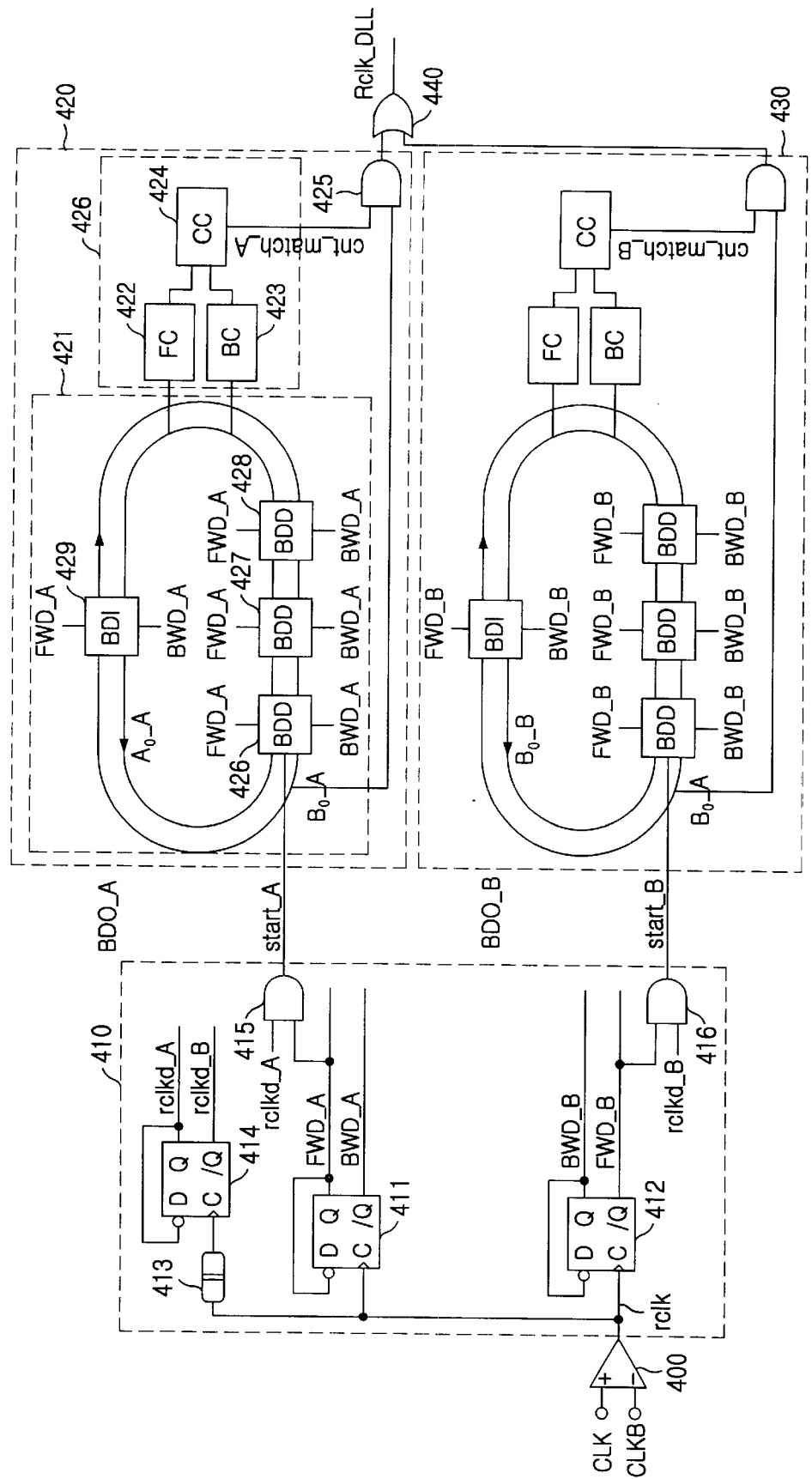
FIG. 4 is a connection diagram of a delay locked loop in accordance with preferred embodiments of the present invention.

There is shown in FIG. 4 a connection diagram of a delay locked loop in accordance with preferred embodiments of the present invention.

As shown in FIG. 4, the delay locked loop of the present invention comprises an input unit 400, a controller 410, a first and a second bi-directional delay blocks 420 and 430, and an OR gate 440.

The input unit 400 receives a clock signal CLK and a non-clock signal CLKB and compares received signals to produce a rising clock Rclk. The controller 410 receives the rising block Rclk as a clock signal, and outputs a first forward signal FWD_A and a second backward signal BWD_B each having a pulse duration corresponding to one cycle of the clock signal CLK, a first backward signal BWD_A and a second forward signal FWD_B each having an opposite phase to the first forward signal FWD_A and the second backward signal BWD_B, and a first and a second start signals START_A and START_B each having a pulse duration corresponding to a time delay to be compensated.

The first bi-directional delay block 420, which includes a bi-directional ring oscillator 421 and a counter unit 426, receives the first forward signal FWD_A, the first backward signal BWD_A and the first start signal START_A from the controller 410 to perform an addition and subtraction adjustment function for a time delay. Similarly, the second bi-directional delay block 430, which includes a bi-directional ring oscillator and a counter unit, receives the second forward signal FWD_B, the second backward signal BWD_B and the second start signal START_B from the controller 410 to perform an addition and subtraction adjustment function for a time delay. The OR gate 440 performs an OR operation on the outputs of the first and second bi-directional delay blocks 420 and 430, to generate the result as a final rising block Rclk_DLL.

The controller 410 includes a first to third D-flip flops 411, 412 and 414, a dummy delay unit 413, and a first and a second AND gates 415 and 416.

The first D-flip flop 411 receives the rising block Rclk as a clock signal to produce a first forward signal FWD_A having a pulse duration corresponding to one cycle of the clock signal CLK and a first backward signal BWD_A having an opposite phase to the first forward signal FWD_A. The second D-flip flop 412 receives the rising clock Rclk as a clock signal to produce a second forward signal FWD_B having a pulse duration corresponding to one cycle of the clock signal CLK and a second backward signal BWD_B having an opposite phase to the second forward signal FWD_B.

The dummy delay unit 413 delays the rising clock Rclk by a skew to compensate the clock signal CLK. The third D-flip flop 414 receives the output of the dummy delay unit 413 as a clock signal to produce a first delay rising clock Rclk_A and a second delay rising clock Rclk_B having an opposite phase to the first delay rising clock Rclk_A. The first AND gate 415 logically combines the first delay rising clock Rclk_A and the first forward signal FWD_A to produce a combined output. The second AND gate 416 logically combines the second delay rising clock Rclk_B and the second forward signal FWD_B to produce a combined output.

The first bi-directional delay block 420 includes a bi-directional ring oscillator 421, a forward counter 422, a backward counter 423, a counter comparator 424 and an AND gate 425. The bi-directional ring oscillator 421 receives the first start signal START_A and performs a ring oscillation in a first and a second directions.

Specifically, the bi-directional ring oscillator 421 receives the first start signal START_A and performs a ring oscillation in a first and a second direction. The forward counter 422 receives a forward loop signal from the bi-directional ring oscillator 421 to count the number of the oscillations. The backward counter 423 receives a backward loop signal from the bi-directional oscillator 421 to count the number of the oscillations. The counter comparator 424 compares the outputs of the forward counter 422 and the backward counter 423 to determine if the outputs (i.e., counted numbers) are identical to each other. The AND gate 425 logically combines the outputs of the bi-directional ring oscillator 421 and the counter comparator 424 to produce a combined value.

By the aforementioned construction, a simplified bi-directional ring oscillator has the capacity to function as the multi-stages of delay line formed by unit bi-directional delays in the prior art.

The construction of the second bi-directional delay block 430 is similar to that of the first bi-directional delay block 420 except that the second start signal START_B is fed to the bi-directional ring oscillator.

The bi-directional ring oscillator 421 includes three unit bi-directional delays 426, 427 and 428, and a bi-directional inverter 429. The unit bi-directional delays 426, 427 and 428, which are connected in series, receive a first output signal A0_A from the bi-directional inverter 429 to output the forward loop signal in the first direction, and receive the backward loop signal from the bi-directional inverter 429 to output a second output signal B0_A in the second direction, under the control of the first start signal START_A, the first forward signal FWD_A and the first backward signal BWD_A. The bi-directional inverter 429 receives the forward loop signal to output the first output signal A0_A in the first direction and receives the second output signal B0_A to produce the backward loop signal in the second direction, under the control of the first forward signal FWD_A and the first backward signal BWD_A.

Figure 5:
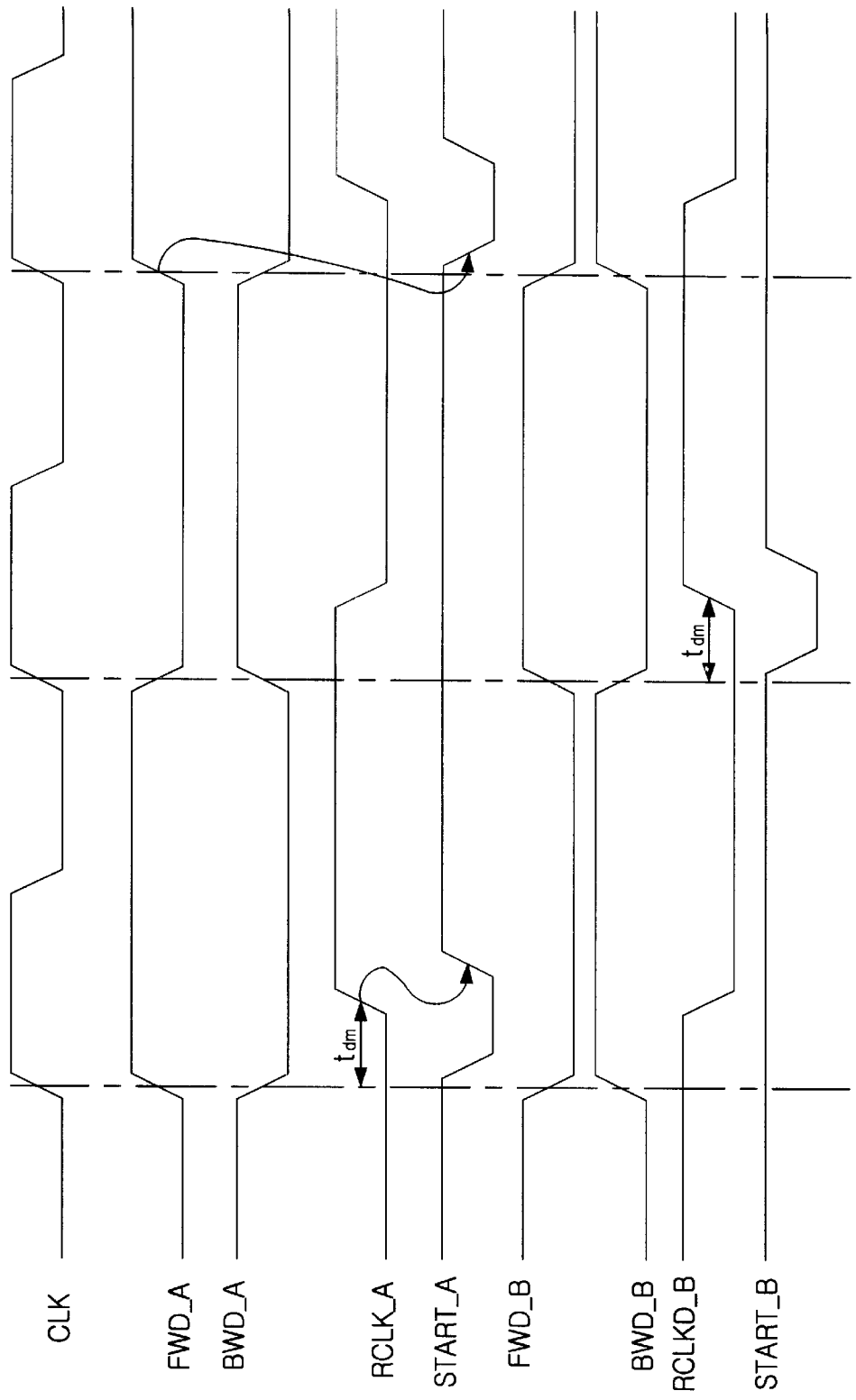
FIG. 5 is a timing diagram illustrating a flow of control signals output from the controller 410 of the present invention.

FIG. 5 is a timing diagram illustrating a flow of control signals output from the controller 410 of the present invention.

Referring to FIG. 5, in the controller 410 of the present invention, the first forward signal FWD_A and the first backward signal BWD_A are out-of-phase and two cycle signals, and similarly the second forward signal FWD_B and the second backward signal BWD_B are out-of-phase and two cycle signals. Accordingly, the first forward signal FWD_A and the second backward signal BWD_B are identical, and the first backward signal BWD_A and the second forward signal FWD_B are identical. The first and second delay rising clocks Rclk_A and Rclk_B are signals reflecting a dummy delay ($t_{dm}$ in FIG. 5). The rising of the first start signal START_A is controlled by the first delay rising clock Rclk_A, and the falling thereof is controlled by the first forward signal FWD_A. The first and second bi-directional delay units 420 and 430 have the same structure and operate alternately every one cycle.

In operation, the delay locked loop generates a clock preceding an external clock by the compensation skew $t_{dm}$, wherein $t_{dm}$ is a fixed value, typically several nanoseconds. Accordingly, these delay locked loops are commonly used to measure the interval between $t_{clk}$ and $t_{dm}$ and to delay a clock by a measured interval.

Figure 6A:
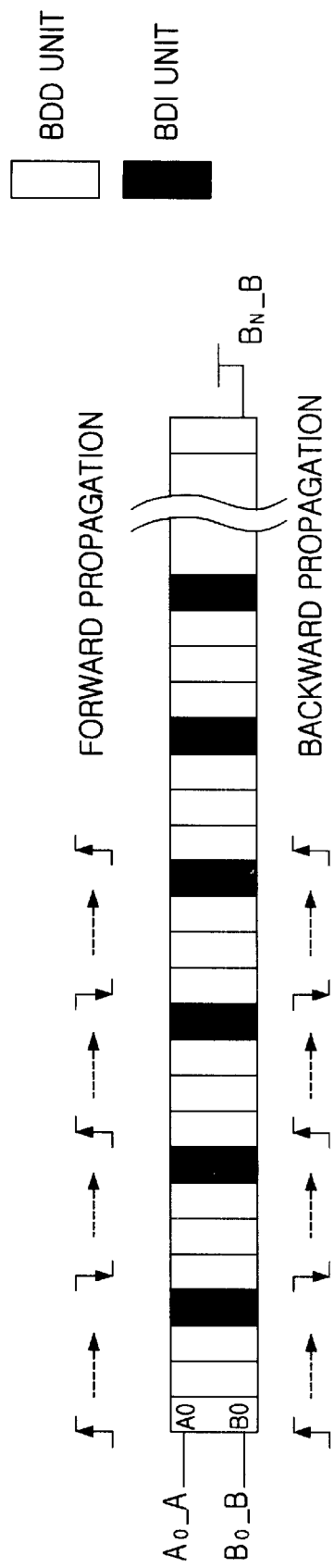
FIG. 6A is a block diagram showing that a unit bi-directional inverter is inserted at the linear bi-directional delays.

FIG. 6A is a block diagram showing that a unit bi-directional inverter is inserted at the linear bi-directional delays.

Referring to FIG. 6A, the inverting operation of the unit bi-directional inverter allows a logic low and a logic high to be alternately rendered to thereby transmit a corresponding signal via a unit delay line. In FIG. 6A, the bi-directional delay unit is indicated by a white block and the bi-directional inverter is indicated by a black block. The overall operation of FIG. 6A is similar to that of the linear bi-directional delay discussed above, except that a phase of the signal is inverted on each occasion that it is passed through the unit bi-directional inverter. That is, a delay to a backward direction may occur in correspondence to a time proceeded to a forward direction. FIG. 6A shows that the signal is periodically passed through the unit bi-directional inverter, so FIG. 6A is contemplated as FIG. 6B as will be explained below.

Figure 6B:
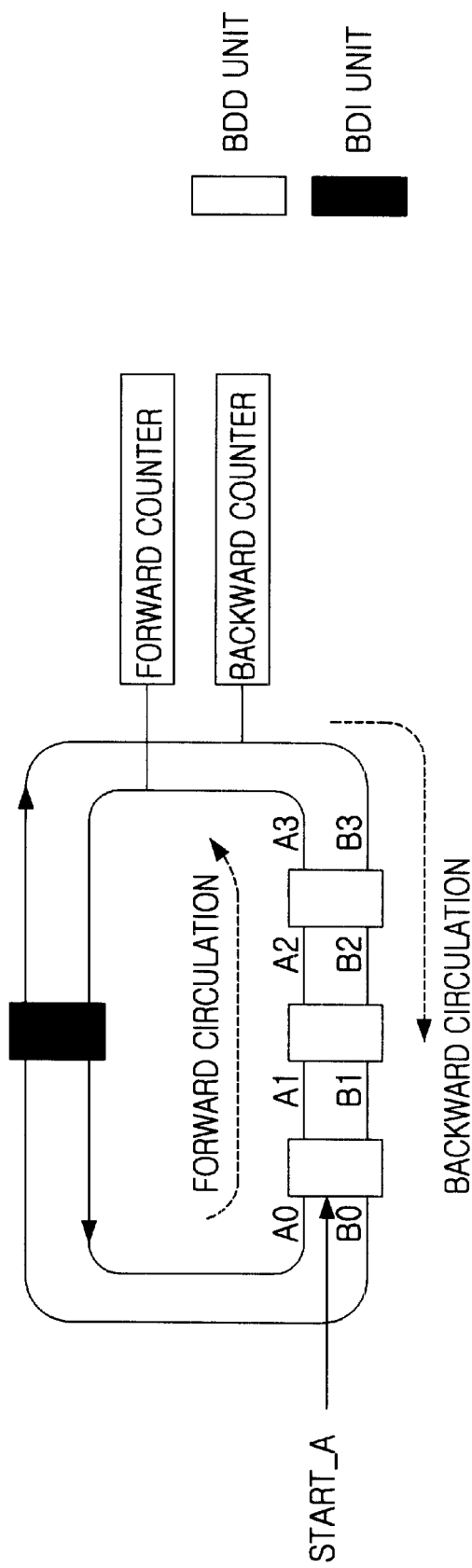
FIG. 6B is a schematic block diagram illustrating the principle of the bi-directional ring oscillator 421 in accordance with a preferred embodiment of the present invention.

FIG. 6B is a schematic block diagram illustrating the principle of the bi-directional ring oscillator 421 in accordance with a preferred embodiment of the present invention.

Referring to FIG. 6B, the bi-directional ring oscillator 421 includes a plurality of unit bi-directional delays and the bi-directional inverter which are connected in a ring fashion, and two counters. Each of the counters serves to count the number of times that a signal is circulated through the ring oscillator. By constructing as the above, a simplified bi-directional ring oscillator has the ability to act as the conventional bi-directional delay with a long length. The present invention requires only one bi-directional inverter, a very small number of unit bi-directional delays and two counters, thereby drastically reducing chip area requirements and covering even low frequency applications (i.e., a large clock cycle), while maintaining the merits of the linear bi-directional delay block. Further, since the bi-directional ring oscillator oscillates on its own, what is needed is a reset operation before that the first start signal START_A is input.

Figure 7A:
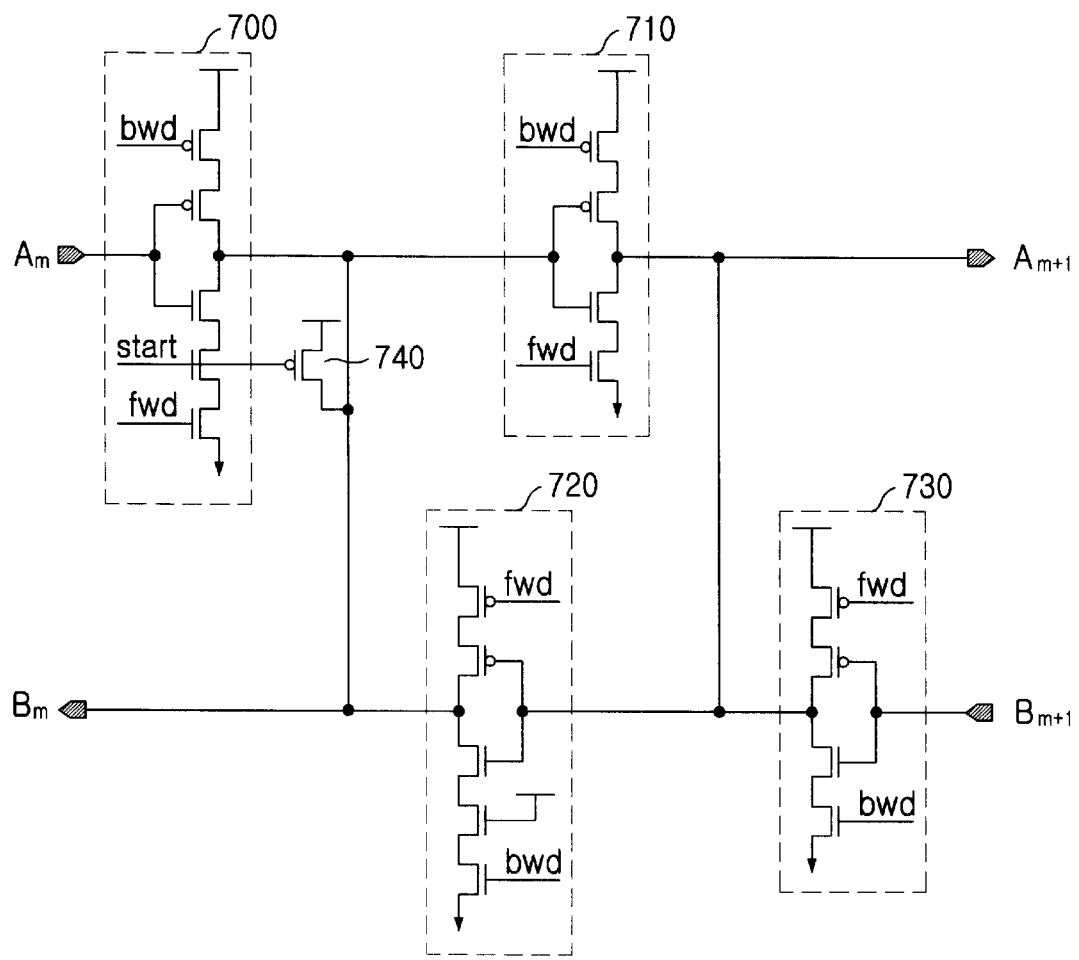
FIG. 7A is a connection diagram of the unit bi-directional delay 426 in a first stage in accordance with the present invention.

FIG. 7A is a connection diagram of the unit bi-directional delay 426 in a first stage in accordance with the present invention.

Referring to FIG. 7A, the unit bi-directional delay 426 used in the present invention includes a first to a fourth three-phase buffer 700, 710, 720 and 730, and a PMOS transistor 740. The first three-phase buffer 700 receives the output of a unit bi-directional delay in the previous stage to produce a second output signal $B_m$, wherein the gate of a PMOS transistor is controlled by the first and second backward signals (BWD) and the gate of an NMOS transistor is controlled by the first and second forward signals (FWD) and the first and second start signals (START) for applying a start input to the bi-directional ring oscillator line forming a ring.

The second three-phase buffer 710 receives the second output signal $B_m$ to produce a first output signal $S_{m+1}$, wherein the gate of a PMOS transistor is controlled by the backward signal BWD and the gate of an NMOS transistor is controlled by the forward signal FWD.

The third three-phase buffer 730 receives the output of the unit bi-directional delay in the previous stage to produce a first output signal $A_{m+1}$, wherein the gate of a PMOS transistor is controlled by the forward signal FWD and the gate of an NMOS transistor is controlled by the backward signal BWD.

The fourth three-phase buffer 720 receives the first output signal $A_{m+1}$ to produce the second output signal $B_m$, wherein the gate of a PMOS transistor is controlled by the forward signal FWD and the gate of an NMOS transistor is controlled by the backward signal BWD.

The gate of the PMOS transistor 740 receives the first and second start signals START_A and START_B, and its source and drain are formed between a line input voltage and the second output signal $B_m$.

Figure 7B:
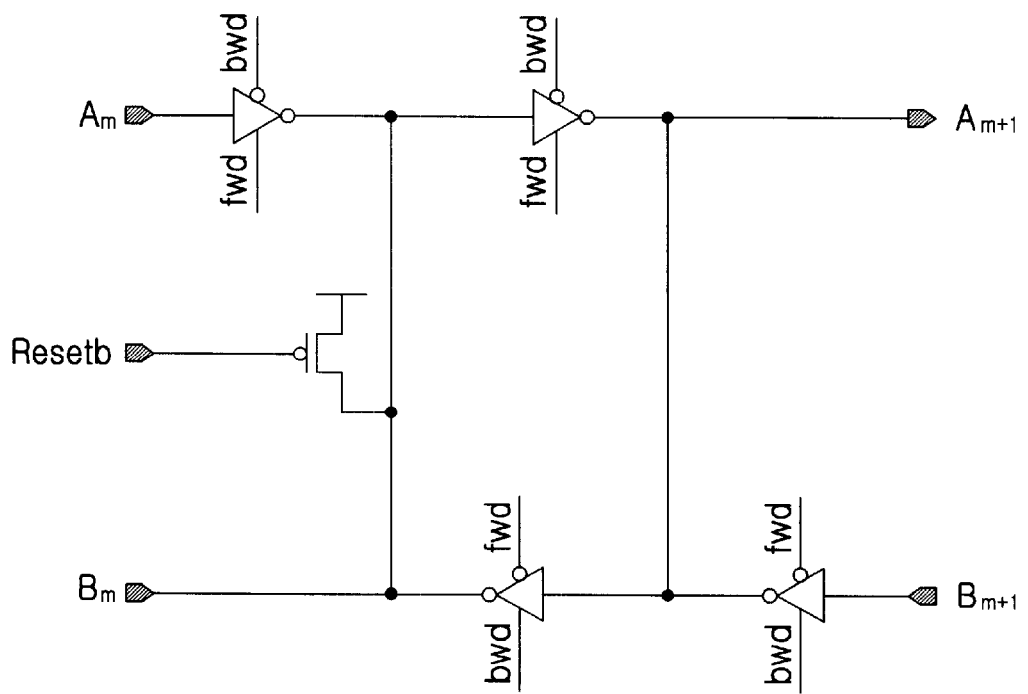
FIG. 7B is a symbolic diagram of the unit bi-directional delay shown in FIG. 7A in accordance with the present invention.

FIG. 7B is a symbolic diagram of the unit bi-directional delay shown in FIG. 7A in accordance with the present invention.

Referring to FIG. 7B, a configuration in which the inverters diametrically opposite each other is similar to that of the unit bi-directional delay proposed by FUJITSU Ltd., except that the PMOS transistor 740 is added for a reset operation.

Figure 8A:
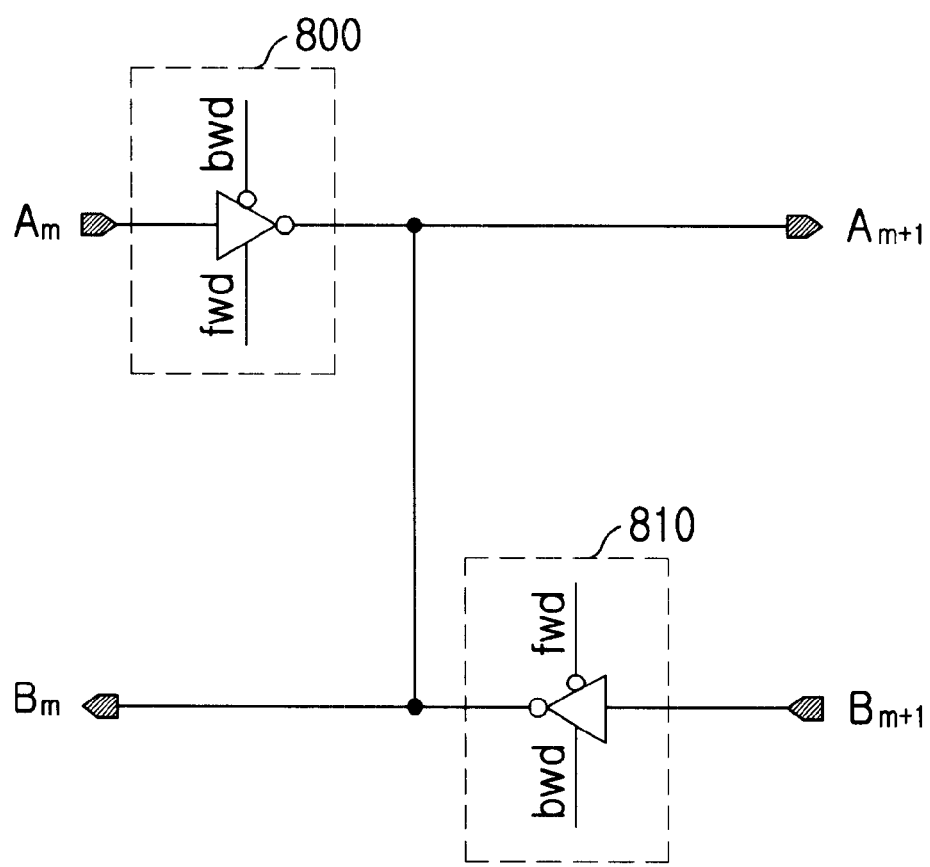
FIG. 8A is a connection diagram of the unit bi-directional inverter 429 of present invention.

FIG. 8A is a connection diagram of the unit bi-directional inverter 429 of present invention.

Referring to FIG. 8A, the unit bi-directional inverter 429 of the present invention includes a first and a second three-phase buffer 800 and 810. The first three-phase buffer 800 receives the first output signal $A_m$ of the unit bi-directional delay in the previous stage to produce a forward loop signal and the second output signals $A_{m+1}$ and $B_m$, wherein the gate of a PMOS transistor is controlled by the backward signal BWD and the gate of an NMOS transistor is controlled by the forward signal FWD. The second three-phase buffer 810 receives a backward loop signal of the unit bi-directional delay in the previous stage to produce the second output signal $A_{m+1}$ and the forward loop signal $B_m$.

Figure 8B:
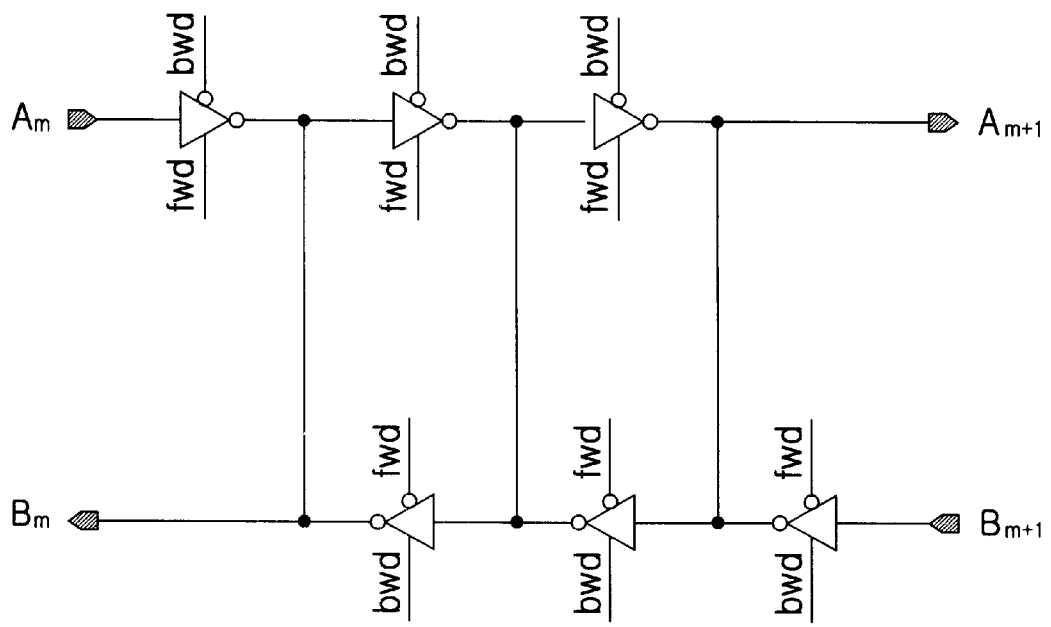
FIG. 8B is a connection diagram in which three unit bi-directional inverters are connected in series for simulation.

FIG. 8B is a connection diagram in which three unit bi-directional inverters are connected in series for simulation.

Figure 9:
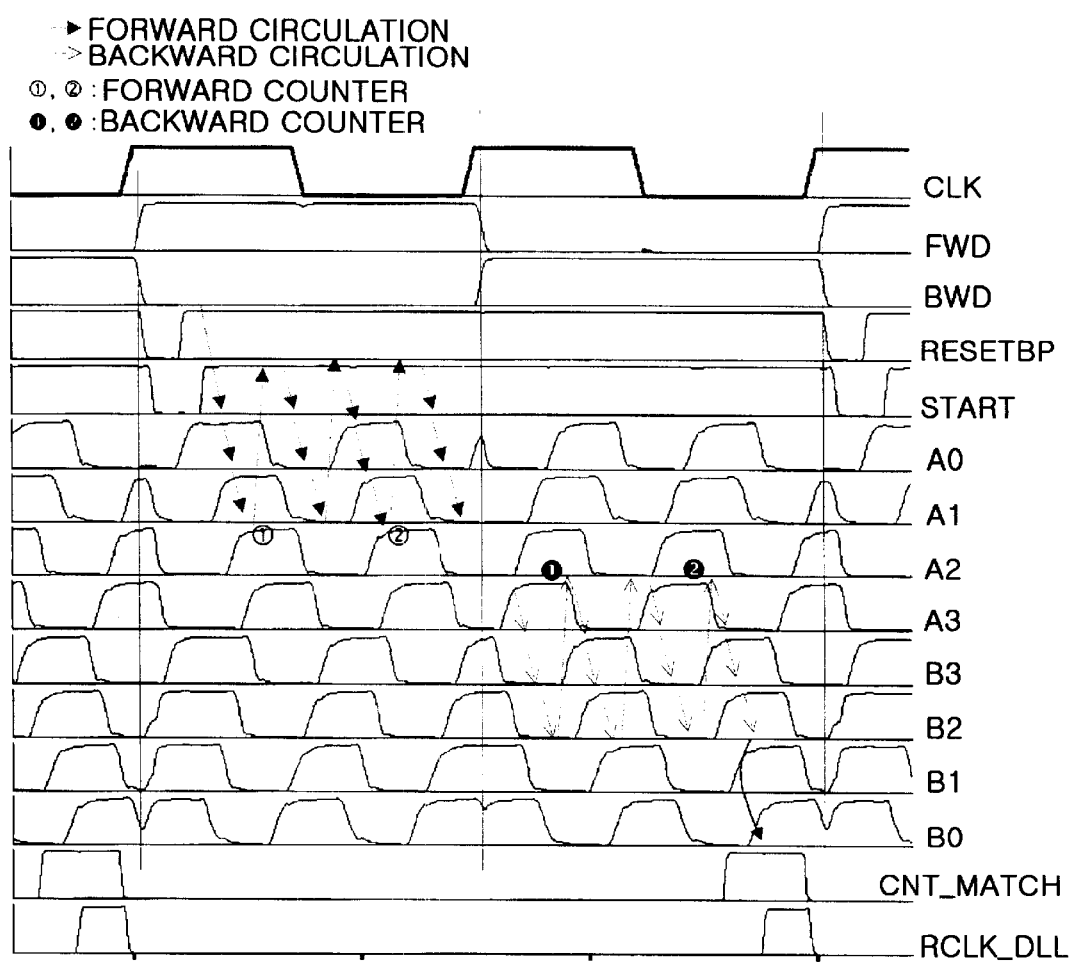
FIG. 9 is a timing diagram of signal waveforms in accordance with the present invention.

FIG. 9 is a timing diagram of signal waveforms in accordance with a preferred embodiment of the present invention.

Referring to FIG. 9, if the forward signal FWD is rendered to logic high and a reset signal "Resetbp" is rendered to logic low prior to the start signal "Start" being inputted, then the bi-directional ring oscillator is reset. If the start signal "Start" is rendered to logic high, the signal is transmitted in a first direction, and the forward counter 422 counts the number of rising edges of the transmitted signal based on a forward loop signal A3.

Alternatively, if the backward signal BWD is rendered to logic high, the signal is conversely transmitted to allow the backward counter to be activated. The counter comparator 424 compares the outputs of the backward counter and the forward counter and produces a counter match signal "count_match" with a logic high value if the outputs are equal to each other. According to the counter match signal "count_match", a rising edge of the output signal B0 of the bi-directional ring oscillator is output as a final rising clock Rclk_DLL. Since one bi-directional ring oscillator produces one DLL clock every two clock cycles, attainment of one DLL per each clock cycle requires an additional bi-directional ring oscillator.

As mentioned above, the present invention employs a bi-directional ring oscillator, a forward counter and a backward counter to thereby reduce chip area requirements, in contrast with the prior art delay locked loop, and operate in low frequency applications, which, in turn, achieve a fast locking and a reduced jitter.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A delay locked loop for use in a semiconductor memory device, comprising:
   an input means for receiving a clock signal and a non-clock signal and comparing the received signals and producing an internal timing signal;
   a control means for receiving the internal timing signal and producing a control signal;
   a bi-directional oscillating means, responsive to the control signal from the control means, for performing a ring oscillation in a first or second direction and performing an additiona and subtraction adjustment function for a time delay;
   a counting means for counting ring oscillations in each of the first and second directions and generating a match signal when a match condition of the counter ring oscillations is satisfied; and
   an output means for performing a combination operation on the respective outputs of the bi-directional oscillating means and the counting means and providing the result as a final internal clock signal.

2. The delay locked loop as recited in claim 1, wherein the control means includes:
   a first D-flip flop for receiving the internal timing signal as a clock signal to produce a first forward signal having a pulse duration corresponding to one cycle of the clock signal and a first backward signal having an opposite phase to the first forward signal;
   a second D-flip flop for receiving the internal timing signal as a clock signal to produce a second forward signal having a pulse duration corresponding to one cycle of the clock signal and a second backward signal having an opposite phase to the second forward signal;
   a delay means for delaying the internal timing signal by an amount to compensate the clock signal;
   a third D-flip flop for receiving the output of the delay means as a clock signal to produce a first delay rising clock and a second delay rising clock having an opposite phase to the first delay rising clock;
   a first combining means logically combining the first delay rising clock and the first forward signal to produce a first combined output; and
   a second combining means logically combining the second delay rising clock and the second forward signal to produce a second combined output.

3. The delay locked loop as recited in claim 2, wherein the first combined output of the first combining means is a first start signal having a pulse duration delayed by a time period in which the internal timing signal is created from an external clock.

4. The delay locked loop as recited in claim 2, wherein the second combined output of the second combining means is a second start signal having a pulse duration delayed by a time period in which the internal timing signal is created from an external clock.

5. The delay locked loop as recited in claim 1, wherein the internal timing signal is a signal synchronized with a rising edge of the clock signal.

6. The delay locked loop as recited in claim 1, wherein the internal timing signal is a signal synchronized with a falling edge of the clock signal.

7. The delay locked loop as recited in claim 1, wherein the bi-directional oscillating means includes:
   a bi-directional delaying means having at least two unit bi-directional delays connected in series, for receiving a first output signal from a bi-directional inverting means to produce a forward loop signal in the first direction, and receiving a backward loop signal from the bi-directional inverting means to produce a second output signal in the second direction, in response to the first start signal, the first forward signal and the first backward signal; and
   a bi-directional inverting means having an odd number of unit bi-directional delays connected in series, for receiving the forward loop signal to produce the first output signal in the first direction and receiving the second output signal to produce the backward loop signal in the second direction, in response to the first forward signal and the first backward signal.

8. The delay locked loop as recited in claim 1, wherein the counting means includes:
   a forward counter for counting the number of oscillation signals rounded in the first direction, in response to the forward loop signal;
   a backward counter for counting the number of oscillation signals rounded in the second direction, in response to the backward loop signal; and
   a comparing means for comparing the counted values of the backward counter and the forward counter to produce the match signal with a logic high value if the counted values are equal to each other.

9. The delay locked loop as recited in claim 1, wherein the output means includes an AND gate for logically combining the respective outputs of the counting means and the bi-directional oscillating means.

10. The delay locked loop of claim 1, wherein the match condition is satisfied when a number of oscillations in the first direction is equal to a number of oscillations in the second direction.

11. A delay locked loop for use in a semiconductor memory device comprising:
    an input means for receiving a clock signal and a non-clock signal and comparing received signals to produce an internal timing signal;
    a control means for receiving the internal timing signal to produce a first forward signal and a second backward signal each having a pulse duration corresponding to one cycle of the clock signal, a first backward signal and a second forward signal each having an opposite phase to the first forward signal and the second backward signal, and a first and a second start signal each having a pulse duration corresponding to a time delay to be compensated;
    a first bi-directional delaying means including a bi-directional ring oscillator and a counter unit, for receiving the first forward signal, the first backward signal and the first start signal from the control means, to perform an addition and subtraction adjustment function for a time delay;

a second bi-directional delaying means including a bi-directional ring oscillator and a counter unit, for receiving the second forward signal, the second backward signal and the second start signal from the control means, to perform an addition and subtraction adjustment function for a time delay; and an output means for performing an OR operation on the outputs of the first and second bi-directional oscillating means, to produce the result as a final internal clock signal.

12. The delay locked loop as recited in claim 11, wherein the first bi-directional delaying means includes:

a bi-directional ring oscillator for receiving the first start signal to perform a ring oscillation in a first and a second direction;

a forward counter for receiving a forward loop signal rounding in the first direction from the bi-directional ring oscillator to thereby count the number of the oscillations;

a backward counter for receiving a backward loop signal rounding in the second direction from the bi-directional ring oscillator to thereby count the number of the oscillations;

a counter comparator for comparing the outputs of the forward counter and the backward counter to determine if the counted values are identical to each other; and an AND gate for logically combining the outputs of the bi-directional ring oscillator and the counter comparator to produce a combined value.

13. The delay locked loop as recited in claim 11, wherein each of the unit bi-directional delays propagates an input signal in a forward direction or a backward direction, responsive to the first backward signal.

14. The delay locked loop as recited in claim 11, wherein each of the unit bi-directional delays propagates an inverted signal in a forward direction or a backward direction, responsive to the first backward signal.

15. A delay locked loop comprising:

an input module configured to receive a clock signal and a non-clock signal and to generate a loop control signal;

a first bi-directional ring oscillator coupled to the input module and configured to perform a ring oscillation in one of a first direction and a second direction in response to the loop control signal;

a first counting module coupled to the first bi-directional ring oscillator, the first counting module configured to count ring oscillations in each of the first direction and the second direction and to generate a first match signal when a match condition of the counted ring oscillations is satisfied; and an output unit coupled to receive the first match signal, the output unit configured to generate a delayed clock signal in response to a combination of the first match signal and an output of the first bi-directional ring oscillator.

16. The delay locked loop of claim 15, wherein the match condition of the counted ring oscillations is satisfied when a number of ring oscillations in the first direction is equal to a number of ring oscillations in the second direction.

17. The delay locked loop of claim 15, wherein the loop control signal comprises:

a first forward signal having a pulse duration equal to one cycle of an internal clock;

a first backward signal that is a logical complement of the first forward signal; and a first start signal generated in response to the first forward signal and a delayed internal timing signal.

18. The delay locked loop of claim 15, further comprising:

a second bi-directional ring oscillator coupled to the input module and configured to perform a ring oscillation in one of a first direction and a second direction in response to the loop control signal; and a second counting module coupled to the second bi-directional ring oscillator, the second counting module configured to count ring oscillations in each of the first direction and the second direction and to generate a second match signal when a number of ring oscillations in the first direction is equal to a number of ring oscillations in the second direction, wherein the output unit is further coupled to receive the second match signals and further configured to generate the delayed clock signal in response to a combination of the second match signal and an output of the second bi-directional ring oscillator.

19. The delay locked loop of claim 18, wherein the loop control signal comprises:

a first forward signal having a pulse duration equal to one cycle of an internal clock;

a first backward signal that is a logical complement of the first forward signal;

a first start signal generated in response to the first forward signal and a delayed internal timing signal;

a second forward signal that is a logical complement of the first forward signal;

a second backward signal that is a logical complement of the second forward signal; and a second start signal generated in response to the second forward signal and a logical complement of the delayed internal timing signal.

20. The delayed locked loop of claim 17, wherein the input module comprises:

an internal clock signal generator configured to receive an external clock signal and a second external signal and to generate the internal timing signal;

a first control signal generator configured to generate the first forward signal and the first backward signal in response to the internal timing signal;

a dummy delay module configured to receive the internal timing signal and to generate the delayed internal timing signal; and a first start signal generator configured to generate the first start signal from the first forward signal and the delayed internal timing signal.

21. The delay locked loop of claim 20, wherein the first control signal generator comprises a D-flip flop.

22. The delay locked loop of claim 20, wherein the first start signal generator comprises an AND gate.

23. The delay locked loop of claim 17, wherein the first bi-directional ring oscillator comprises:

a plurality of bi-directional delay units connected in series, one of the plurality of bi-directional delay units coupled to receive the first start signal; and a bi-directional inverter connected to both ends of the series of bi-directional delay units, thereby forming a ring, the bi-directional inverter also having a signal output coupled to the first counting module;

wherein, in response to the first forward signal, the first start signal is propagated through the plurality of bi-directional delay units and the bi-directional inverter in a forward direction and inverted by the bi-directional inverter as it propagates;

wherein, in response to the first backward signal, the first start signal is propagated through the plurality of bi-directional delay units and the bi-directional inverter in a backward direction and inverted by the bi-directional inverter as it propagates; and wherein the bi-directional inverter produces a forward loop signal on the signal output each time it inverts a signal propagating in the forward direction and a backward loop signal on the signal output each time it inverts a signal propagating in the backward direction.

24. The delay locked loop of claim 23, wherein each of the bi-directional delay units comprises:

a forward input terminal;

a forward output terminal;

a backward input terminal;

a backward output terminal;

a first and a second three-phase buffer connected in series between the forward input terminal and the forward output terminal, wherein an output of the first three-phase buffer is also connected to the backward output terminal, the first forward signal and the first backward signal connected to respective control terminals of each of the first and second three-phase buffers; and a third and a fourth three-phase buffer connected in series between the backward input terminal and the backward output terminal, wherein an output of the third three-phase buffer is also connected to the forward output terminal, the first forward signal and the first backward signal connected to respective control terminals of each of the third and fourth three-phase buffers.

25. The delay locked loop of claim 24, further comprising:

a switch coupled between a line voltage and the output of the first three-phase buffer, the switch operating in response to the first start signal;

wherein the first start signal is also coupled to an additional control terminal of the first three-phase buffer.

26. The delay locked loop of claim 24, wherein each of the first and second three-phase buffers comprises:

a first and a second PMOS transistor coupled in series between a line voltage and an output node of the buffer, a gate terminal of the first PMOS transistor coupled to the first backward signal and a gate terminal of the second PMOS transistor coupled to an input node of the buffer; and a first and second NMOS transistor coupled in series between the output node and a ground voltage, a gate terminal of the first NMOS transistor coupled to the input node and a gate terminal of the second NMOS transistor coupled to the first forward signal.

27. The delay locked loop of claim 26, wherein the first three-phase buffer further comprises a third NMOS transistor serially coupled between the first and second NMOS transistors, a gate terminal of the third NMOS transistor coupled to the first start signal.

28. The delay locked loop of claim 24, wherein each of the third and fourth three-phase buffers comprises:

a first and a second PMOS transistor coupled in series between a line voltage and an output node of the buffer, a gate terminal of the first PMOS transistor coupled to the first forward signal and a gate terminal of the second PMOS transistor coupled to an input node of the buffer; and a first and second NMOS transistor coupled in series between the output node and a ground voltage, a gate terminal of the first NMOS transistor coupled to the input node and a gate terminal of the second NMOS transistor coupled to the first backward signal.

* * * * *